(12) United States Patent
Kunida et al.

(10) Patent No.: US 9,329,023 B2
(45) Date of Patent: May 3, 2016

(54) ROTATION CONTROL APPARATUS AND METHOD AND DISK DRIVING APPARATUS USING THE SAME

(71) Applicant: Rohm Co., Ltd., Kyoto (JP)

(72) Inventors: Yuji Kunida, Kyoto (JP); Norihiro Maeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 75 days.

(21) Appl. No.: 13/773,795

(22) Filed: Feb. 22, 2013

(65) Prior Publication Data

US 2013/0215728 A1 Aug. 22, 2013

(30) Foreign Application Priority Data

Feb. 22, 2012 (JP) .................... 2012-36578

(51) Int. Cl.
*H02P 6/18* (2006.01)
*H02P 3/12* (2006.01)
*G01B 7/30* (2006.01)
*G01R 31/34* (2006.01)
*H02P 27/06* (2006.01)
*H02P 6/16* (2016.01)

(52) U.S. Cl.
CPC *G01B 7/30* (2013.01); *G01R 31/34* (2013.01); *H02P 6/16* (2013.01); *H02P 27/06* (2013.01); *H02P 2203/11* (2013.01); *H02P 2205/01* (2013.01)

(58) Field of Classification Search
CPC ............. H02M 7/003; B60L 2200/26; B60L 2220/14; B60L 7/14; H02P 6/00; H02P 6/16; H02P 6/182; H02P 6/185; H02P 6/205; H02P 1/42; H02P 2203/03; H02P 2203/09; H02P 25/04; H02P 25/085; H02P 25/14; H02P 27/06; G01R 31/34; G01R 31/346; G11B 19/20; G11B 19/247; G11B 19/28; G11B 21/083; G11B 5/5526; G11B 7/08529; G11B 7/00
USPC ............. 369/53.43, 116, 47.53, 44.34, 44.35, 369/30.17; 702/64, 65; 318/626, 400.11, 318/400.12; 360/78.04, 78.07, 78.11
See application file for complete search history.

(56) References Cited

U.S. PATENT DOCUMENTS

| | | | |
|---|---|---|---|
| 5,001,405 A | | 3/1991 | Cassat |
| 5,299,149 A | * | 3/1994 | Morita et al. .................. 702/64 |
| 5,481,167 A | * | 1/1996 | Rohrbaugh et al. ..... 318/400.35 |
| 6,885,163 B2 | * | 4/2005 | Heidrich .................. 318/400.11 |
| 2004/0012355 A1 | * | 1/2004 | Sosseh et al. ................. 318/439 |
| 2006/0076911 A1 | * | 4/2006 | Kuroshima et al. .......... 318/254 |

(Continued)

FOREIGN PATENT DOCUMENTS

| | | |
|---|---|---|
| JP | 03-207250 | 9/1991 |
| JP | 06-113585 | 4/1994 |
| JP | 11-122977 | 4/1999 |

*Primary Examiner* — Dionne H Pendleton
(74) *Attorney, Agent, or Firm* — Fish & Richardson P.C.

(57) ABSTRACT

A rotation control apparatus includes: a controller configured to supply test currents to a plurality of different paths of a motor when the motor is stopped; and a stop position detector configured to detect a rotational position of the motor based on an order of current values of the test currents. The controller causes one of the test currents to flow through one of the plurality of different paths, measure time taken until the corresponding detection voltage reaches a reference voltage, and set electrical conduction time of the test currents based on a result of the measurement.

16 Claims, 14 Drawing Sheets

(56) References Cited

U.S. PATENT DOCUMENTS

| | | | |
|---|---|---|---|
| 2009/0309523 A1* | 12/2009 | Ikei | H02P 3/12 318/380 |
| 2010/0314566 A1* | 12/2010 | Huerta-Ochoa et al. | 251/129.11 |
| 2011/0057601 A1* | 3/2011 | Hiltbold | 318/729 |
| 2011/0215744 A1* | 9/2011 | Kocher et al. | 318/400.07 |
| 2012/0098474 A1* | 4/2012 | Boscolo | H02P 6/185 318/400.33 |
| 2012/0119687 A1* | 5/2012 | Murai et al. | 318/400.06 |
| 2012/0286714 A1* | 11/2012 | Tokunaga | H02P 6/182 318/400.34 |

* cited by examiner

ROTATION CONTROL APPARATUS AND METHOD AND DISK DRIVING APPARATUS USING THE SAME

CROSS-REFERENCE TO RELATED APPLICATION

This application is based upon and claims the benefit of priority from Japanese Patent Application No. 2012-36578, filed on Feb. 22, 2012, the entire contents of which are incorporated herein by reference.

TECHNICAL FIELD

The present disclosure relates to a technique for controlling rotation of a rotor, and more particularly relates to a rotation control apparatus and method for controlling rotation of a motor including a stator having a plurality of coils and a magnetic rotor, and a disk driving apparatus using the same.

BACKGROUND

A brushless direct current (DC) motor generally includes a rotor having a permanent magnet, and a stator having star-connected multiphase coils. In the brushless DC motor, the coils are excited by controlling current supplied to the coils and the rotor is rotated and driven relative to the stator. The brushless DC motor generally includes a sensor such as a Hall device, an optical encoder or the like in order to detect a rotational position of the rotor and provides a proper torque to the rotor by switching current supplied to the multiphase coils.

There has been proposed a sensorless motor in which a rotational position of a rotor is detected without using a sensor such as a Hall device or the like in order to make the motor smaller. The proposed sensorless motor obtains positional information by detecting an induced voltage generated in a coil by measuring a potential of a central point of a wiring of the motor, for example. However, it is impossible to know the rotational position of the sensorless motor when it is stopped since the positional information of the sensorless motor is obtained from the induced voltage generated during the rotation of the rotor. If the motor starts with the rotational position unknown, the rotor may be rotated reverse to a desired rotation direction. However, for example, in a case where a spindle motor of a hard disk is rotated, it is preferable to minimize reverse rotation of the spindle motor and, accordingly, there is a need to properly detect rotational position of the rotor when starting the motor.

SUMMARY

The present disclosure provides various embodiments of a technique for correctly detecting a rotational position of a rotor at the time of rotation start of a motor.

According to some embodiments of the present disclosure, there is provided a rotation control apparatus including: a controller configured to supply test currents to a plurality of different paths of a motor including a stator having a plurality of coils and a magnetic rotor when the motor is stopped, the plurality of different paths including the plurality of coils; and a stop position detector configured to convert the test currents flowing through the plurality of paths into detection voltages for measurement, compare voltage values of the detection voltages, determine an order of current values of the test currents based on the comparison, and detect a rotational position of the motor based on the order.

For example, in a case where a motor includes three coils of U, V and W phases, test currents flowing through 6 paths including U to V path, V to U path, V to W path, W to V path, W to U path and U to W path may be measured and an order of these test currents may be determined. The stop position detector need not determine all orders completely but may determine only orders required to detect the rotational position of the motor. For example, it may be determine which of the paths is the first rank path and the second rank path. According to the rotation control apparatus, the rotational position of the motor when it is stopped can be detected in the same range as that of the motor being driven, which will be described in more details later, thereby more correctly controlling the rotation of the motor.

In the rotation control apparatus, the controller causes one of the test currents to flow through one of the plurality of different paths, measures time taken until the corresponding detection voltage reaches a reference voltage, and sets an electrical conduction time of the test currents based on a result of the measurement. With this configuration, the test currents flowing through the plurality of paths can be optimized without depending on the characteristics (R characteristic and L characteristic) of the motor, thereby improving the detection precision of the rotational position of the rotor when the motor is stopped.

In the rotation control apparatus, the stop position detector may include an amplifier configured to generate the detection voltage, and the reference voltage may be set to a median value or its neighborhood value of an output range of the amplifier. With this configuration, it is possible to put the detection voltage in the output range of the amplifier without depending on the characteristics of the motor.

In the rotation control apparatus, input/output characteristics of the amplifier may be changeable. With this configuration, it is possible to cope with motors having different characteristics.

In the rotation control apparatus, the stop position detector may further include a table storing the order in association with the rotational position of the motor and detect the rotational position of the motor by referring to the table. In addition, the stop position detector may detect the rotational position of the motor based on a combination of a path having the highest current value and a path having the second-highest current value.

In the rotation control apparatus, when the rotational position of the motor is detected when the motor is stopped, the controller may supply the test current, which is smaller than a current supplied to the path when the motor is being driven, to the path. In addition, when the rotational position of the motor is detected when the motor is stopped, the controller may supply the test current to the path for a period of time which is shorter than a period of time for which a current is supplied to the path when the motor is being driven. With this configuration, it is possible to prevent the motor from being rotated when the rotational position of the motor is detected.

In the rotation control apparatus, the stop position detector may further include a sample/hold circuit configured to hold the detection voltage, and the controller may pre-charge the sample/hold circuit by supplying the test currents to the paths before measuring the test currents flowing through the plurality of paths. With this configuration, it is possible to improve the detection precision since a voltage value of the sample/hold circuit can be made to approach, in advance, a voltage value to be measured.

In addition, upon detecting the rotational position of the motor, when the test current is flown through a path first selected, the controller may measure time taken until the detection voltage reaches the reference voltage and set the electrical conduction time of the test current based on a result of the measurement.

In addition, upon pre-charging the sample/hold circuit, when the test current is flown, the controller may measure time taken until the detection voltage reaches the reference voltage and set the electrical conduction time of the test current based on a result of the measurement.

According to some other embodiments of the present disclosure, there is provided a rotation control method including: supplying test currents to a plurality of different paths of a motor including a stator having a plurality of coils and a magnetic rotor when the motor is stopped, the plurality of different paths including the plurality of coils; converting the test currents flowing through the plurality of paths into detection voltages, and measuring the detection voltages; comparing voltage values of the detection voltages and determining an order of current values of the test currents based on the comparison; detecting a rotational position of the motor based on the order; and causing one of the test currents to flow through one of the plurality of different paths, measuring time taken until the corresponding detection voltage reaches a reference voltage, and setting an electrical conduction time of the test currents based on a result of the measurement.

According to some other embodiments of the present disclosure, there is provided a disk driving apparatus including: a motor configured to rotate a disk, the motor including a stator having a plurality of coils and a magnetic rotor; a rotation control apparatus configured to control rotation of the motor, the rotation control apparatus including: a controller configured to supply test currents to a plurality of different paths of the motor when the motor is stopped, the plurality of different paths including the plurality of coils; and a stop position detector configured to convert the test currents flowing through the plurality of paths into detection voltages for measurement, compare voltage values of the detection voltages, determine an order of current values of the test currents based on the comparison, and detect a rotational position of the motor based on the order, wherein the controller causes one of the test currents to flow through one of the plurality of different paths, measures time taken until the corresponding detection voltage reaches a reference voltage, and sets an electrical conduction tune of the test currents based on a result of the measurement; and a read/write controller configured to write/read data into/from the disk.

According to some other embodiments of the present disclosure, there is provided a computer equipped with the above-configured disk driving apparatus, wherein the disk driving apparatus is at least one of an optical drive and a hard disk drive.

According to some other embodiments of the present disclosure, there is provided a disk playback apparatus (for example, a game machine, a DVD player or the like) equipped with the above-configured disk driving apparatus as a disk playback means.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
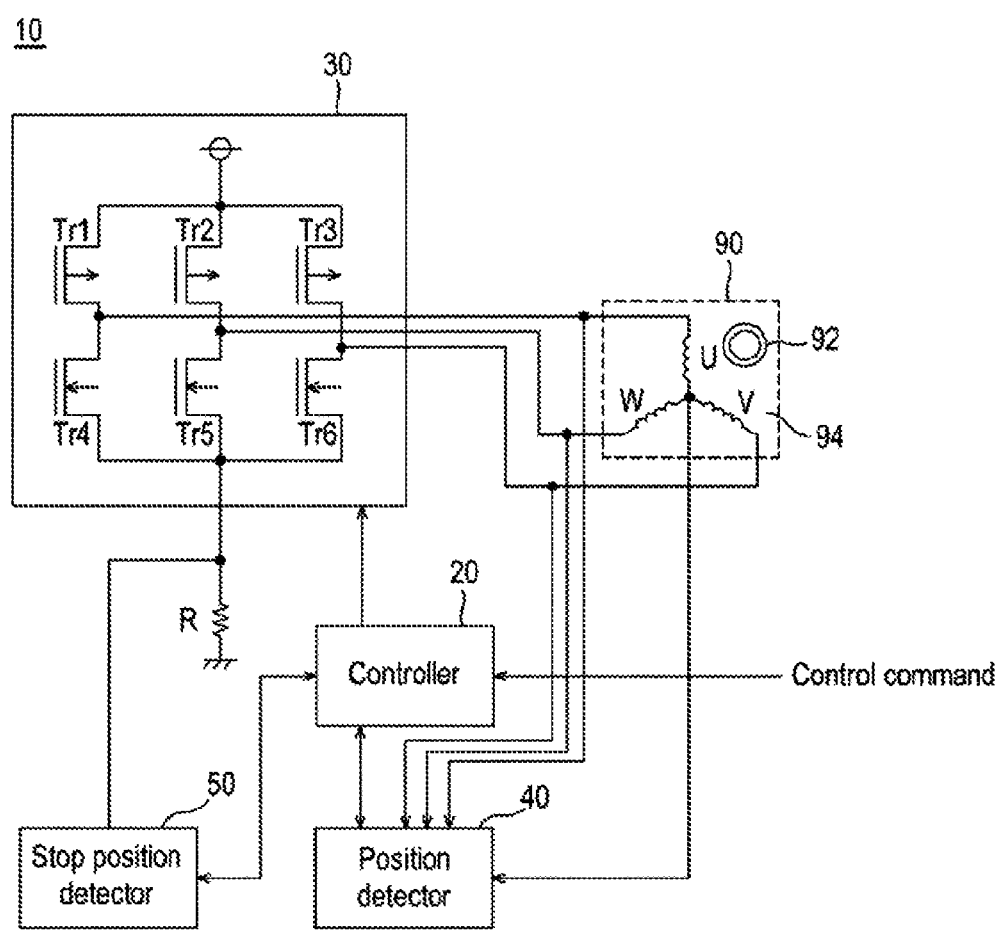
FIG. 1 is a view showing a configuration of a rotation control apparatus according to some embodiments.
Figure 8:
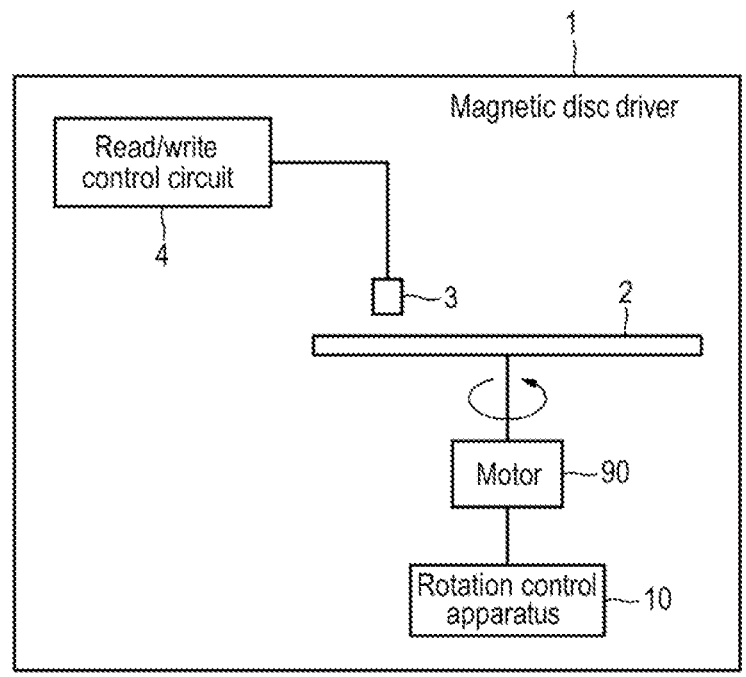
FIG. 8 is a view showing a configuration of a magnetic disc driver according to some embodiments.

FIG. 1 shows a configuration of a rotation control apparatus 10 according to an embodiment. FIG. 8 shows a configuration of a magnetic disc driver 1 which is one example of a disc driver on which the rotation control apparatus 10 shown in FIG. 1 is mounted. The magnetic disc driver 1 is mounted in a personal computer or the like and drives a magnetic disc such as a hard disc (HD), a flexible disc (FD) or the like. The magnetic disc driver 1 includes a disc 2, a magnetic head 3, a read/write control circuit 4, a motor 90 and a rotation control apparatus 10. The rotation control apparatus 10 controls driving of the motor 90 for rotating the disc 2 according to a command from a host apparatus (not shown) such as a personal computer or the like. The read/write control circuit 4 controls write and read operations of data for the disc 2 according to a command from the host apparatus. The read/ write control circuit 4 scans the rotating disc 2 by moving the magnetic head 3 in a radial direction of the disc 2 and writes/reads data onto/from the disc 2. Although FIG. 8 shows the magnetic disc driver 1, the present disclosure may be applied to an optical disc driver or the like for driving an optical disc or an optic-magnetic disc such as a digital versatile disc (DVD), a compact disc (CD), a mini disc (MD) or the like.

Returning to FIG. 1, the rotation control apparatus 10 controls rotation of the motor 90. The motor 90 may be a sensorless brushless DC motor. The motor 90 includes a rotor 92 having a permanent magnet and a stator 94 having star-connected three-phase coils U, V and W. The rotation control apparatus 10 includes a controller 20, a power circuit 30, a position detector 40 and a stop position detector 50. In this embodiment, since the motor 90 can be driven using techniques well known in the art, a typical driving method of the motor 90 will be described in brief and description will be focused on a technique for detecting a rotational position of the rotor 92 when the motor 90 is started.

The controller 20 controls currents supplied to the three-phase coils U, V and W constituting the stator 94 of the motor 90. The power circuit 30 includes six switching transistors Tr1 to Tr6. By turn-on/off the transistors Tr1 to Tr6, the currents supplied to the coils U, V and W are switched on/off. The turn-on/off of the transistors Tr1 to Tr6 is controlled by the controller 20. The position detector 40 detects a potential of a central point of a wiring of the motor 90 when the motor 90 is being driven, detects induced voltages generated in the coils U, V and W, and obtains positional information of the motor 90. The controller 20 acquires a control command for a rotational direction, a rotational speed and the like of the motor 90 and determines the currents supplied to the coils U, V and W based on the rotational position of the motor 90 detected by the position detector 40.

The stop position detector 50 detects the position of the motor 90 when the motor is stopped (i.e., before the motor 90 starts to rotate). When the motor 90 is stopped, test currents are supplied to a plurality of different paths including the coils U, V and W of the motor 90, and the stop position detector 50 measures the currents flowing through the plurality of paths, respectively, determines an order of the measured current values, and detects the rotational position of the motor 90 based on the determined order. The currents flowing through the coils U, V and W are converted into voltages by means of a detection resistor R and are measured. The supply of the test currents is performed by the controller 20 and the power circuit 30. In order to prevent the motor 90 from being rotated by the test currents, it is preferable that values of the test currents are smaller than a value of the currents supplied when the motor 90 is driven and a supply time of the test currents is shorter than a supply time of the current when the motor 90 is driven.

Figure 2:
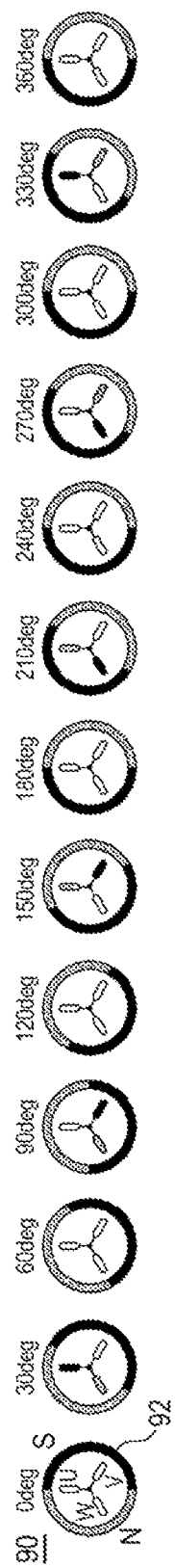
FIG. 2 is a sequence diagram showing an aspect of rotation of a motor, according to some embodiments.

FIG. 2 is a sequence diagram showing an aspect of rotation of the motor 90. The upper portion in FIG. 2 shows rotational positions of the motor 90, the middle portion in FIG. 2 shows polarities of the coils U, V and W that are excited when currents are supplied to the coils U, V and W to allow the controller 20 to drive the motor 90, and the lower portion in FIG. 2 shows states of the transistors Tr1 to Tr6 of the power circuit 30 controlled by the controller 20 and sequence numbers. Switching of driving current is performed at an interval of 60 degrees with reference to a certain angle (for example, 0 degree). The turn-on/off of the transistors Tr1 to Tr6 is switched in an ascending order of the sequence numbers if the motor 90 is clockwise rotated or in a descending order of the sequence numbers if the motor 90 is counterclockwise rotated. For example, if the motor 90 is clockwise rotated from a position of an electrical angle of 0 degrees, the controller 20 first turns on the transistors Tr1 and Tr4. Accordingly, the coils U and V are excited to S and N poles, respectively, thereby rotating the rotor 92 clockwise. When the rotational angle of the motor 90 reaches 60 degrees, the controller 20 switches the transistor Tr4 to turn-off and the transistor Tr5 to turn-on. Accordingly, the coils V and U are excited to S and N poles, respectively, thereby further rotating the rotor 92 clockwise.

Figure 3:
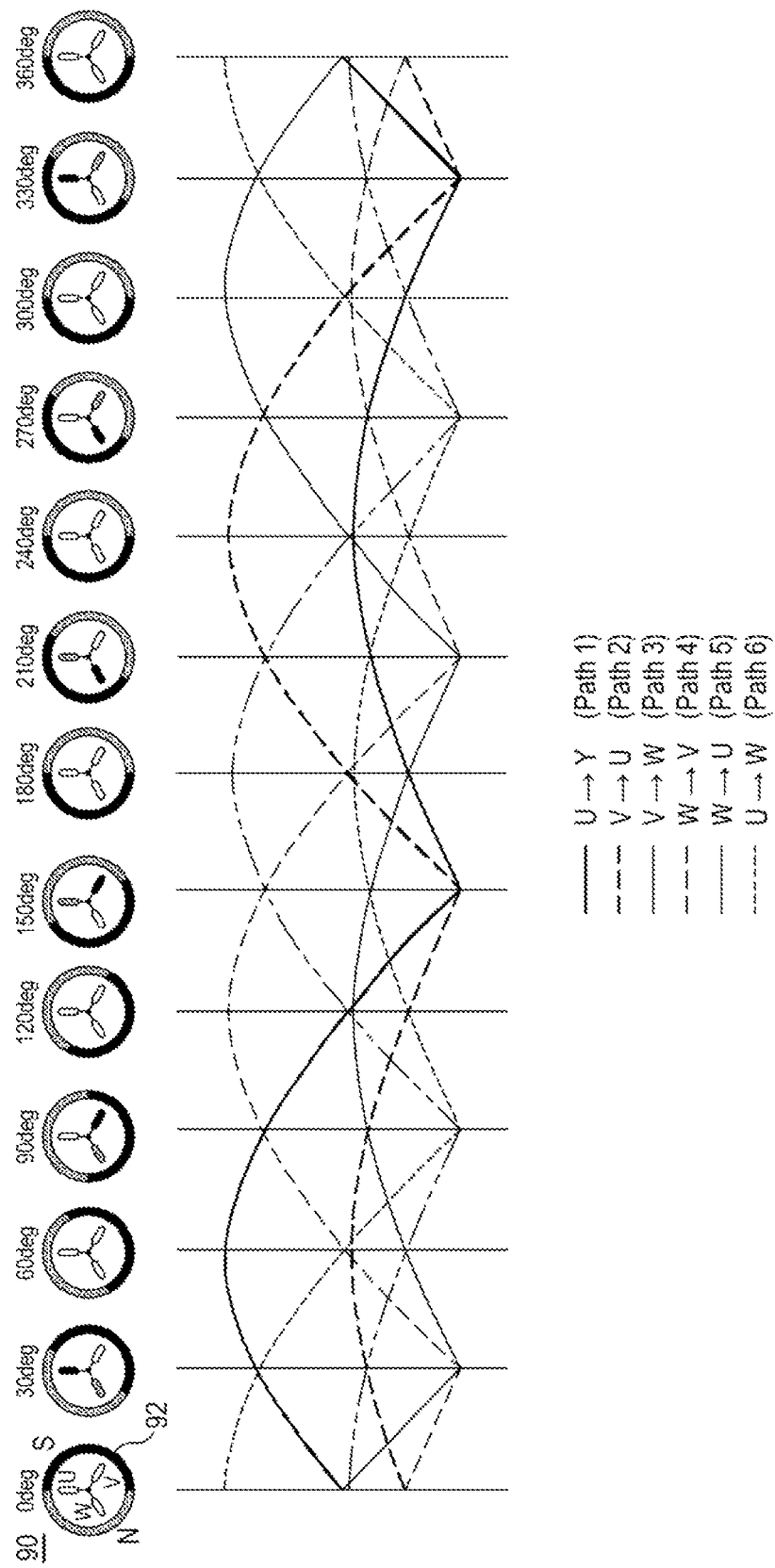
FIG. 3 is a view showing a relationship between a rotational angle of the motor when it is stopped and current values when currents flows through a plurality of paths including coils U, V and W.

FIG. 3 shows a relationship between a rotational angle of the motor 90 when it is stopped and current values when currents flow through a plurality of paths including the coils U, V and W. The coils U, V and W are placed in a magnetic field of the rotor 92, which is a permanent magnet, and have different apparent inductances due to an effect of the magnetic field of the rotor 92. Accordingly, values of currents flowing through the coils U, V and W show dependency on the rotational angle, as shown in FIG. 3. FIG. 3 shows the current values of the following 6 paths.

Thick solid line: U phase→V phase (Path 1: the same as sequence No. 4 in FIG. 2)

Thick dotted line: V phase→U phase (Path 2: corresponding to sequence No. 1 in FIG. 2)

Medium solid line: V phase→W phase (Path 3: corresponding to sequence No. 2 in FIG. 2)

Medium dotted line: W phase→V phase (Path 4: corresponding to sequence No. 5 in FIG. 2)

Thin solid line: W phase→U phase (Path 5: corresponding to sequence No. 6 in FIG. 2)

Thin dotted line: U phase→W phase (Path 6: corresponding to sequence No. 3 in FIG. 2)

In this manner, a positional relationship between the rotor 92 and the coils U, V and W can be known by measuring current values of the 6 paths. In this embodiment, the current values of the 6 paths are measured, the measured current values are compared, and the rotational position of the motor 90 is detected from a combination of a path in which the highest current value is measured and a path in which the second-highest current value is measured. For example, if the two upper-ranked paths include Path 1 and Path 6, the rotational angle of the motor 90 is between 0 degree and 60 degrees, as shown in FIG. 3.

When the position of the motor 90 is detected from the combination of the two upper-ranked paths, the position of the motor 90 can be detected in the same angular range as the sequence of current control when the motor 90 is being driven as shown in FIG. 2. According to the methods of the related art, the position of the motor 90 is detected in an angular range deviated by 30 degrees from the angular range for current control when the motor 90 is being driven, such as, for example, a range from 30 degrees to 90 degrees or a range from 90 degrees to 150 degrees. Accordingly, there was a need to perform the current control after making a 30 degree shift of a positional angle of the motor 90 detected when the motor 90 is started. On the contrary, according to this embodiment, since the positional information of the motor 90 can be obtained in the same angular range as that of the motor 90 when it is being driven, the motor 90 can be more correctly driven using the obtained positional information and a rotation in a reverse direction can be minimized when the motor 90 is started.

Figure 4:
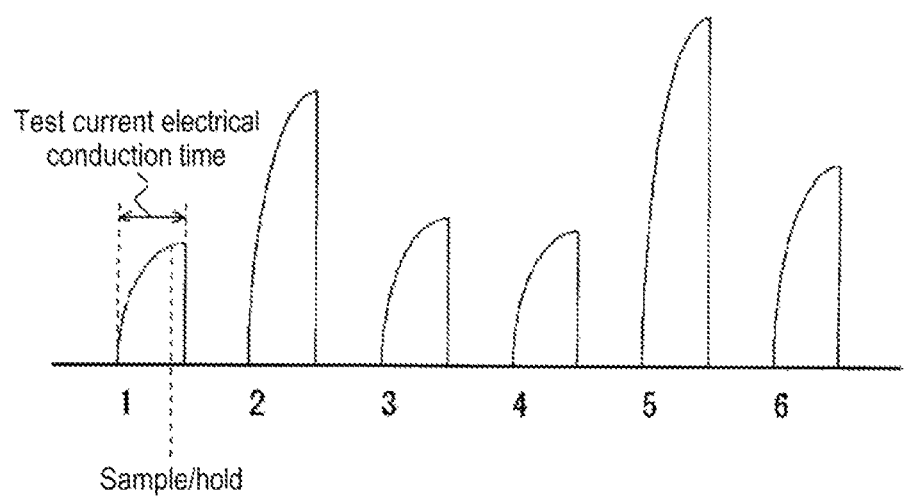
FIG. 4 is a view showing an example of voltage values detected by a detection resistor when test currents are flowing.

FIG. 4 shows an example of voltage values detected by the detection resistor R when test currents are flowing. When the test currents begin to be supplied, the currents flow through the paths including the coils U, V and W and a potential difference across the detection resistor R slowly increases. When the currents are supplied to the 6 paths, the stop position detector 50 samples and holds voltage values after the lapse of a period of time from electrical conduction and compares these voltage values. Since two upper-ranked paths are Path 2 and Path 5 in the example of FIG. 4, it can be seen from FIG. 3 that the position of the motor 90 lies between 180 degrees and 240 degrees.

Figure 5:
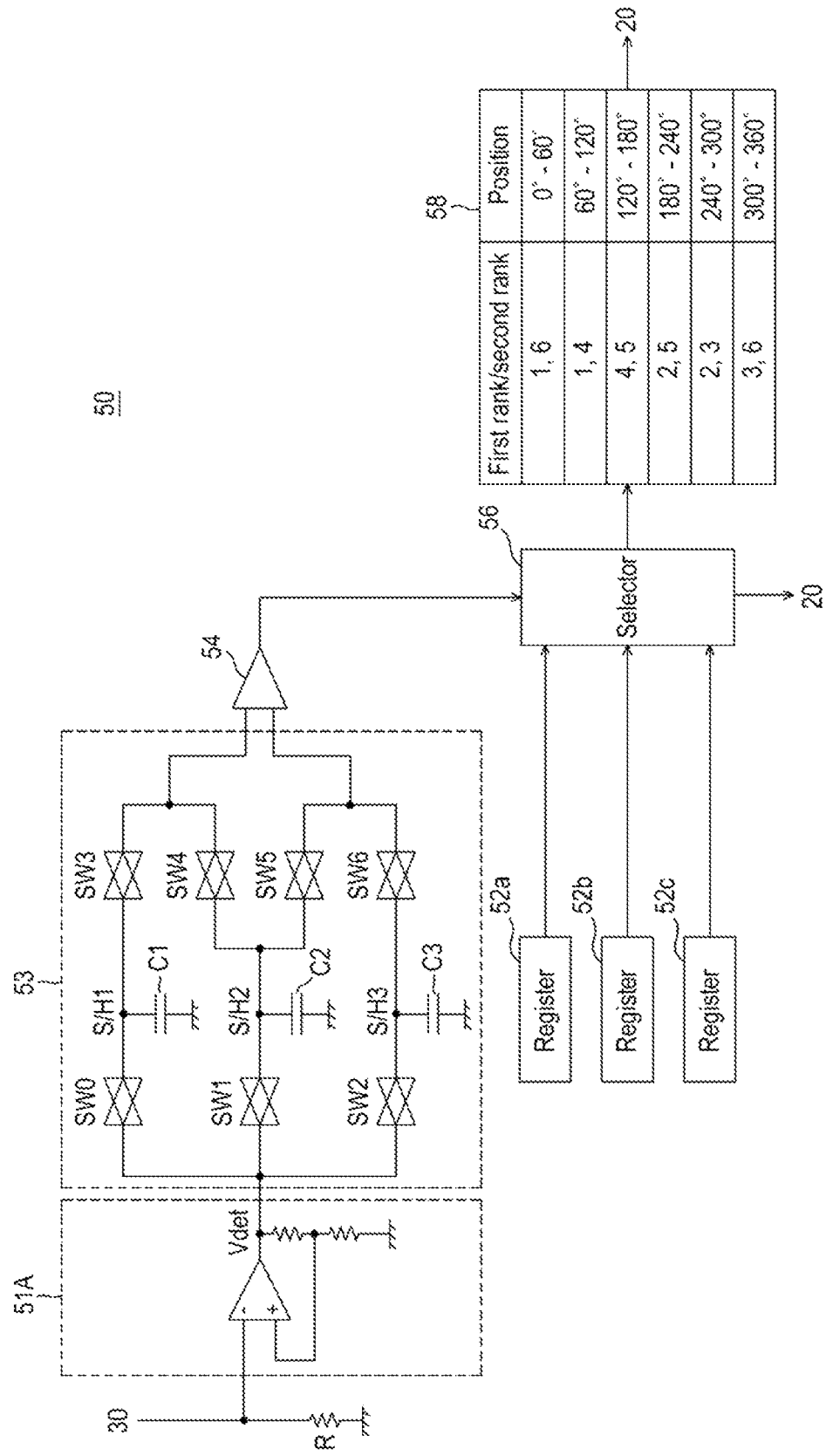
FIG. 5 is a schematic view showing a first configuration of a stop position detector.

FIG. 5 is a schematic view showing a first configuration of the stop position detector 50. When the motor 90 is stopped, the controller 20 controls currents to be supplied to the paths including the coils U, V and W. The currents flowing through the coils U, V and W are converted into voltage values by the detection resistor R, which are then amplified by an amplifier 51A. A detection voltage Vdet output from the amplifier 51A is input to a sample/hold circuit 53 including switches SW0 to SW6 and capacitors C1 to C3. The switches SW0 to SW2 are switched to hold the voltage value produced by the detection resistor R (or the detection voltage Vdet output from the amplifier 51A) in any one of the capacitors C1 to C3. The switches SW3 to SW6 are switched to input any one of voltage values S/H1 to S/H3 held in the capacitors C1 to C3 into a comparator 54. The comparator 54 compares the voltage values S/H1 to S/H3 held in the capacitors C1 to C3 to generate a comparison signal CMP which is then output to a selector 56. Registers 52a to 53c store data indicating to which path the voltage values S/H1 to S/H3 held in the capacitors C1 to C3 correspond. In this embodiment, each of the registers 52a to 53c may store 3-bit data since voltage values for the 6 paths are measured. When the measurement of the voltage values for the 6 paths is completed, the selector 56 outputs data indicating which paths are two upper-ranked paths. The stop position detector 50 has a table 58 storing a combination of two upper-ranked paths in association with the rotational position of the motor 90, detects the rotational position of the motor 90 by referring to the table 58, and outputs the detected rotational position to the controller 20.

Figure 6:
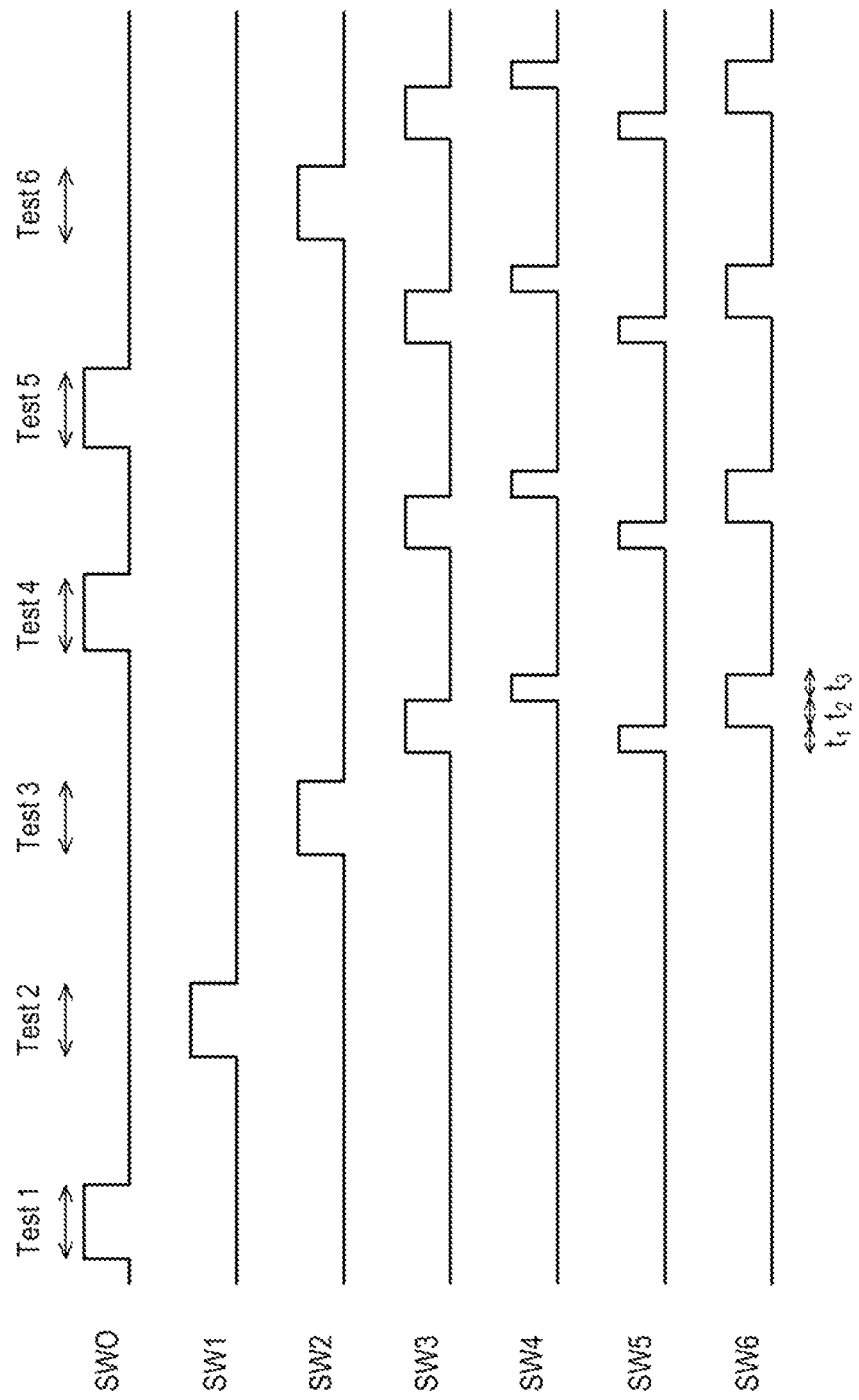
FIG. 6 is a timing chart for illustrating an operation of the stop position detector.

FIG. 6 is a timing chart for illustrating an operation of the stop position detector 50. In this example, an operation of each element of the stop position detector 50 may be controlled by the controller 20, although a configuration for control may be installed within the stop position detector 50. The controller 20 switches the switch SW0 on while supplying current to Path 1 and holds a voltage value produced by the detection resistor R in the capacitor C1. In addition, the controller 20 stores "1" in the register 52a in order to record the fact that a result of measurement on Path 1 is held in the capacitor C1. Subsequently, the controller 20 switches the switch SW1 on while supplying current to Path 2 and holds a measured voltage value in the capacitor C2. At that time, "2" is stored in the register 52b. In addition, the controller 20 switches the switch SW2 on while supplying current to Path 3 and holds a measured voltage value in the capacitor C3. At that time, "3" is stored in the register 52c.

When the results of measurement are input to the three capacitors C1 to C3, the stop position detector 50 compares these voltage values S/H1 to S/H3 to determine the rank thereof. First, when the controller 20 switches the switches SW3 and SW5 on for a period of time t1, the voltage values S/H1 and S/H2 held in the capacitors C1 and C2, respectively, are input to the comparator 54. That is, the result of measurement of Path 1 is compared to the result of measurement of Path 2. A comparison signal CMP is output to the selector 56. Subsequently, when the controller 20 switches the switches SW3 and SW6 on for a period of time t2, the voltage values S/H1 and S/H3 held in the capacitors C1 and C3, respectively, are input to the comparator 54, and the result of measurement of Path 1 is compared to the result of measurement of Path 3. A comparison signal CMP is output to the selector 56. Finally, when the controller 20 switches the switches SW4 and SW6 on for a period of time t3, the voltage values S/H2 and S/H3 held in the capacitors C2 and C3, respectively, are input to the comparator 54, and the result of measurement of Path 2 is compared to the result of measurement of Path 3. A comparison signal CMP is output to the selector 56. As a result, the three comparison signals CMP are serially output from the comparator 54 to the selector 56. The selector 56 determines one of the three paths, which has the lowest voltage value, based on the three comparison signals CMP and transfers the voltage value of the determined path to the controller 20. It is assumed in this example that Path 1 has the lowest measured voltage value.

The controller 20 replaces a result of subsequently performed measurement of Path 4 for the result of measurement of the lowest ranked path transferred from the selector 56. That is, in order to hold the result of measurement of Path 4 in the capacitor C1 in which the result of measurement of the lowest ranked path transferred from the selector 56, the controller 20 holds a measured voltage value in the capacitor C1 by switching the switch SW0 on while supplying current to Path 4. At that time, the controller 20 stores "4" in the register 52a. Accordingly, the result of measurement of Path 4, the result of measurement of Path 2 and the result of measurement of Path 3 are held in the capacitor C1, the capacitor C2 and the capacitor C3, respectively. Subsequently, similarly to the above-described procedure, the voltage values S/H1 to S/H3 held in the capacitors C1 to C3 are compared to each other and a comparison signal CMP is output to the selector 56. The selector 56 transfers the result of measurement of the lowest ranked path to the controller 20.

The same procedure is repeated for Path 5 and Path 6. Finally, after measurement of Path 6 is completed, two upper ranked paths among the 6 paths are determined by the selector 56. The controller 20 detects the position of the motor 90 from a combination of the two upper ranked paths by referring to the table 58. Accordingly, even if the motor has no sensor to detect its position, it is possible to correctly detect the position of the motor when the motor 90 is stopped.

Figure 7:
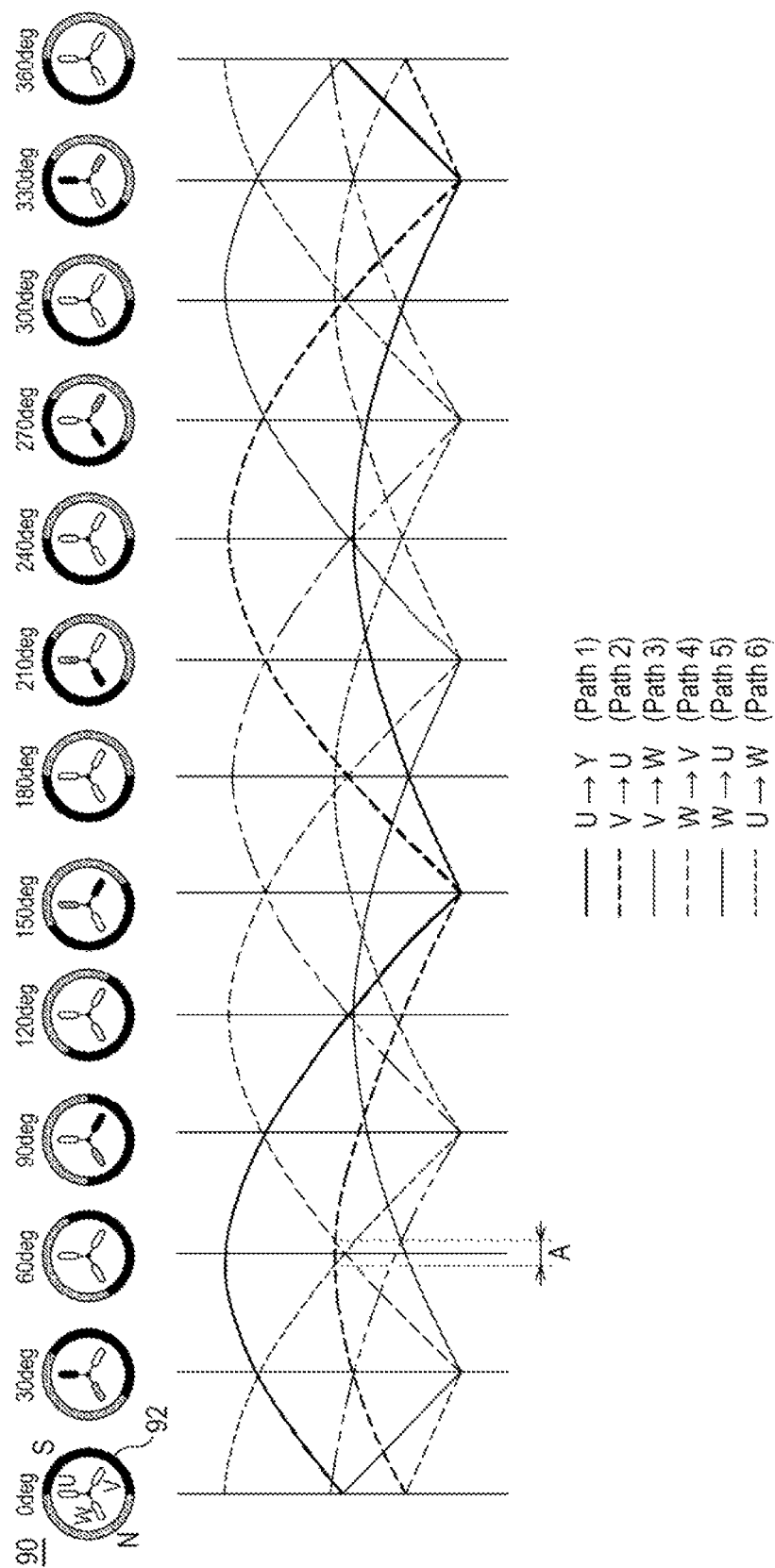
FIG. 7 is a view showing another example of a relationship between a rotational angle of the motor when it is stopped and current values when currents flow through a plurality of paths including the coils U, V and W.

FIG. 7 shows another example of a relationship between rotational angles of the motor 90 when it is stopped and current values when currents flow through a plurality of paths including the coils U, V and W. The example of FIG. 7 shows that a current value of Path 2 is larger than current values of Path 4 and Path 6 in a range A around 60 degrees, and has a different path order from the example of FIG. 3. In this case, for example, if it is determined that a combination of a path having the highest current value and a path having the second-highest current value corresponds to Path 1 and Path 2, respectively, the stop position detector 50 may determine that the position of the motor 90 is between 0 degree and 60 degrees or between 60 degrees and 120 degrees. That is, the range A may be regarded as being included in a range from 0 degree to 60 degrees or a range from 60 degrees to 120 degrees. If a range of change of the path order is relatively wide and the above determination shows a large error, the stop position detector 50 may determine the angle of the motor 90 in consideration of paths having the third and lower current values, in addition to the combination of the path having the highest current value and the path having the second-highest current value.

It will be appreciated that the disclosed embodiment is merely one example and it is to be understood by those skilled in the art that combinations of elements and processes of the embodiment can be modified in various ways and such modification falls within the scope of the present disclosure.

Although three sample/hold capacitors are used to compare currents flowing through 6 paths in the disclosed embodiment, 4 or more sample/hold capacitors may be used for such comparison. In addition, the configuration used to determine the rank of current value is not limited to that shown in FIG. 5. For example, the rank of current value may be determined by a software process by a general-purpose circuit such as a central processing unit (CPU).

Although the position of the motor 90 is detected at the 60 degree interval in the disclosed embodiment, the position may be detected at a 30 degree interval by considering a path order, in addition to the combination of the path having the highest current value and the path having the second-highest current value.

Before measuring current values when currents are supplied to the above-described 6 paths, in preparation for the measurement, a current may be supplied to any of the 6 paths, voltage values S/H1 to S/H3 at that time may be held in the capacitors C1 to C3 and the sample/hold circuit 53 may be pre-charged. For example, by supplying a current to Path 1 twice, the voltage values S/H1 to S/H3 of the capacitors C1 to C3 may be made to approach, in advance, the values to be measured. This can improve a detection precision of the detection voltage Vdet in the sample/hold circuit 53.

Figure 9:
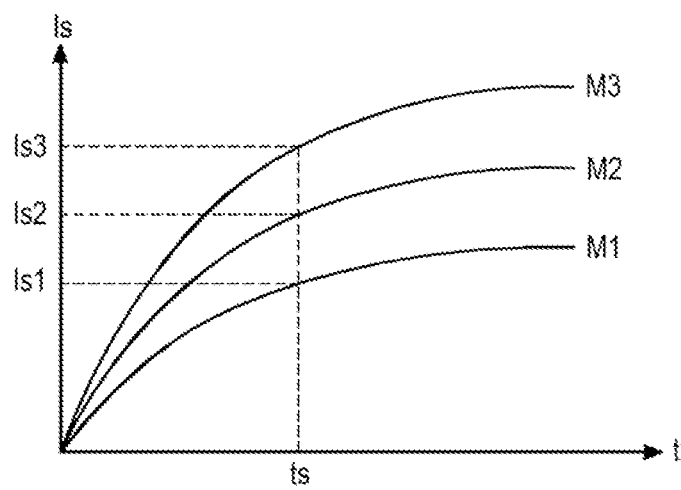
FIG. 9 is a view showing a relationship between a current value of a test current and an electrical conduction time.

FIG. 9 is a view showing a relationship between a current value of test current Is and electrical conduction time ts. In FIG. 9, reference numerals M1 to M3 denote behaviors (temporal change in a current value of the test current Is) when the test current Is is flown into motors 90 having different characteristics (R characteristics or L characteristics), respectively. As shown, the current value of the test current Is basically increases with increase in the electrical conduction time ts.

However, in the stop position detector 50 of the above-described first configuration, the electrical conduction time ts of the test current Is was fixed to a constant value without depending on the characteristics of the motor 90. Accordingly, the current value of the test current Is swung significantly depending on the characteristics of the motor 90 connected to the rotation control apparatus 10.

The stop position detector 50 converts the test current Is into detection voltages Vdet which are then compared to each other to detect the rotational position of the motor 90. Accordingly, if the current value of the test current Is is greatly swung depending on the characteristics of the motor 90, the generation of the detection voltage Vdet may be disrupted, which may result in difficulty in correct detection of the rotational position of the motor 90.

Figure 10:
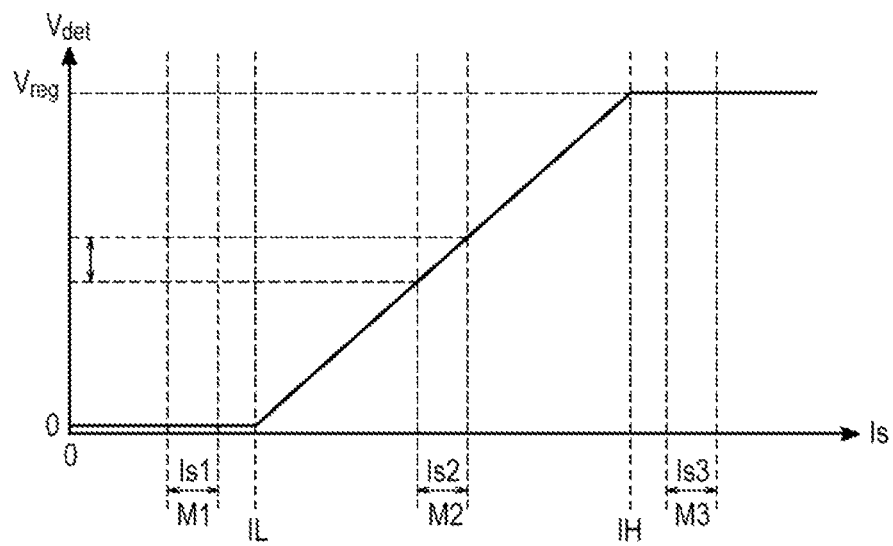
FIG. 10 is a view showing a relationship between the test current and a detection voltage (a first example).

FIG. 10 is a view showing a relationship between the test current Is and the detection voltage Vdet (a first example of an input/output characteristic set in the amplifier 51A). According to the input/output characteristic in FIG. 10, if the test current Is is smaller than a lower limit IL of a detectable range, the detection voltage Vdet becomes the minimum (0) of an output range without depending on the test current Is. If the test current Is is larger than the lower limit IL of the detectable range and smaller than an upper limit IH of the detectable range, the detection voltage Vdet is linearly increased depending on the test current Is. If the test current Is is larger than the upper limit IH of the detectable range, the detection voltage Vdet becomes the maximum (Vreg) of the output range without depending on the test current Is.

Accordingly, the stop position detector 50 of the above first configuration has a low detection precision for the rotational positions of motors (M1 and M3) in which the current value of the test current Is is deviated from the detectable range, although it may detect the rotational position of a motor (M2) in which the current value of the test current Is is within the detectable range.

Figure 11:
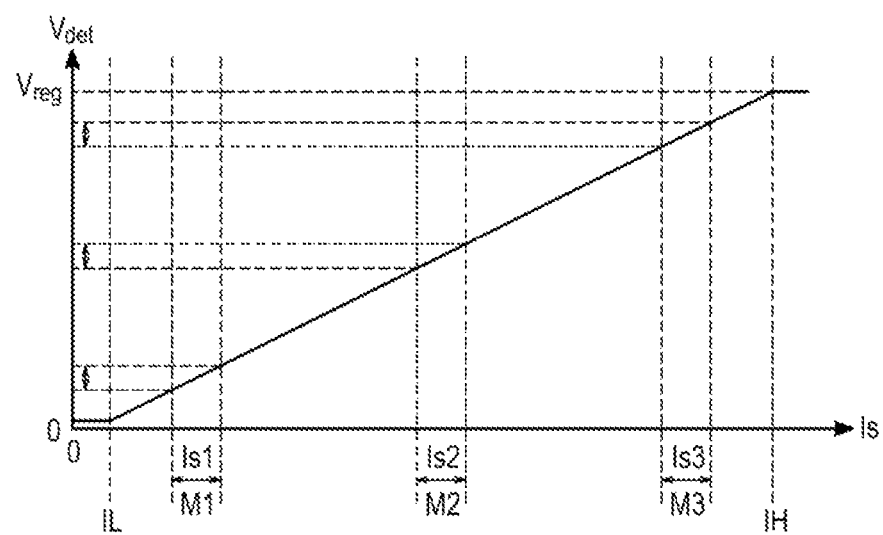
FIG. 11 is a view showing another relationship between the test current and the detection voltage (a second example).

FIG. 11 is a view showing another example of a relationship between the test current Is and the detection voltage Vdet (a second example of the input/output characteristic set in the amplifier 51A). The input/output characteristic in FIG. 11 is set to make the detectable range of the test current Is wider than that in the first example (FIG. 10). Such setting of the input/output characteristic can increase the number of types of motors capable of detecting their rotational positions when they are stopped. However, as a tradeoff against the widened detectable range of the test current Is, a variation in the detection voltage Vdet with respect to the variation of the test current Is is decreased, which may result in a low detection precision of the rotational position.

Thus, the stop position detector 50 of the above first configuration has room for improvement since coping with a variety of motors is incompatible with improvements to the detection precision.

Figure 12:
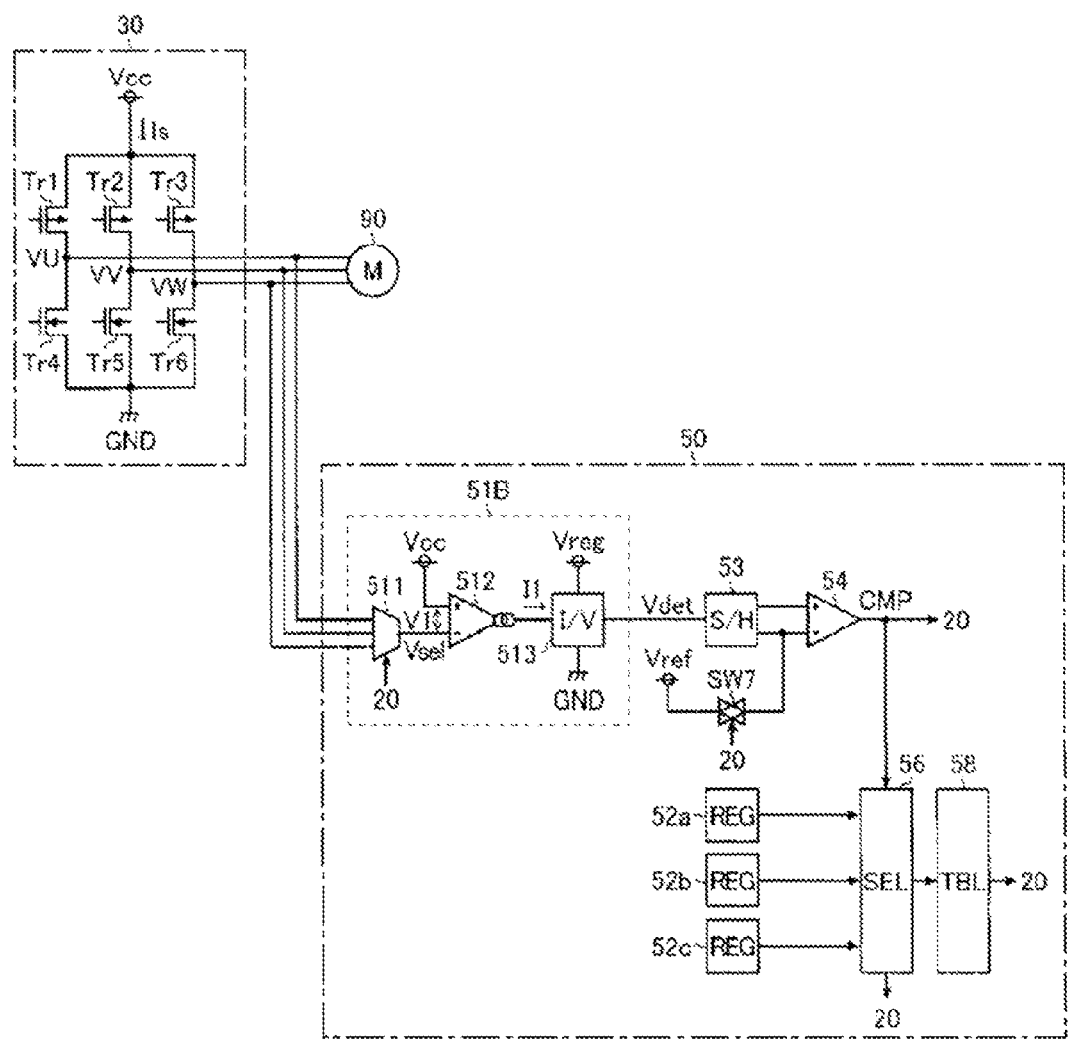
FIG. 12 is a schematic view showing a second configuration of the stop position detector, according to some embodiments.

FIG. 12 is a schematic view showing a second configuration of the stop position detector 50. The stop position detector 50 of the second configuration has substantially the same configuration as the previously-described first configuration. Therefore, the same elements as the first configuration are denoted by the same reference numerals as FIG. 5 and explanation of which is not repeated in the interest of brevity. The following description is focused on characteristic portions of the second configuration.

As a first characteristic portion, the stop position detector 50 of the second configuration further includes a switch SW7 which is instructed by the controller 20 to make electrical connection/disconnection between an inverted input terminal (−) of the comparator 54 and an application terminal of a reference voltage Vref. An operation of the switch SW7 will be described later.

As a second characteristic portion, the stop position detector 50 of the second configuration employs a configuration that on-resistance components of the transistors Tr1 to Tr3 forming the power circuit 30 are used to detect the test current Is. This configuration eliminates a need of the detection resistor R.

In addition, this configuration causes a change in the configuration of an amplifier 51B. In more details, the amplifier 51B includes a selector 511, a current output amplifier 512 and a current/voltage converter 513.

The selector 511 is instructed by the controller 20 to selectively output one of the output voltages VU, VV and VW of the power circuit 30 as a select voltage Vsel. In more detail, the selector 511 outputs the output voltage VU when the transistor Tr1 is turned on, outputs the output voltage VV when the transistor Tr2 is turned on, and outputs the output voltage VW when the transistor Tr3 is turned on. Accordingly, the select voltage Vsel output from the selector 511 corresponds to a voltage value depending on the test current Is flowing through one of the transistors Tr1 to Tr3 (on-resistance: Ron) from the application terminal of the source voltage Vcc (i.e., Vsel=Vcc−Is×Ron).

The current output amplifier 512 generates a detection current I1 depending on a differential voltage V1 (=Is×Ron) corresponding to a difference between the source voltage Vcc applied to its non-inverted input terminal (+) and the select voltage Vsel applied to its inverted input terminal (−). In other words, the current output amplifier 512 generates the detection current I1 (=α×Is) depending on the test current Is.

The current/voltage converter 513 converts the detection current I1 into the detection voltage Vdet which is then output to the sample/hold circuit 53. In addition, an output range of the current/voltage converter 513 is set to have a minimum of 0 and a maximum of Vreg.

Figure 13:
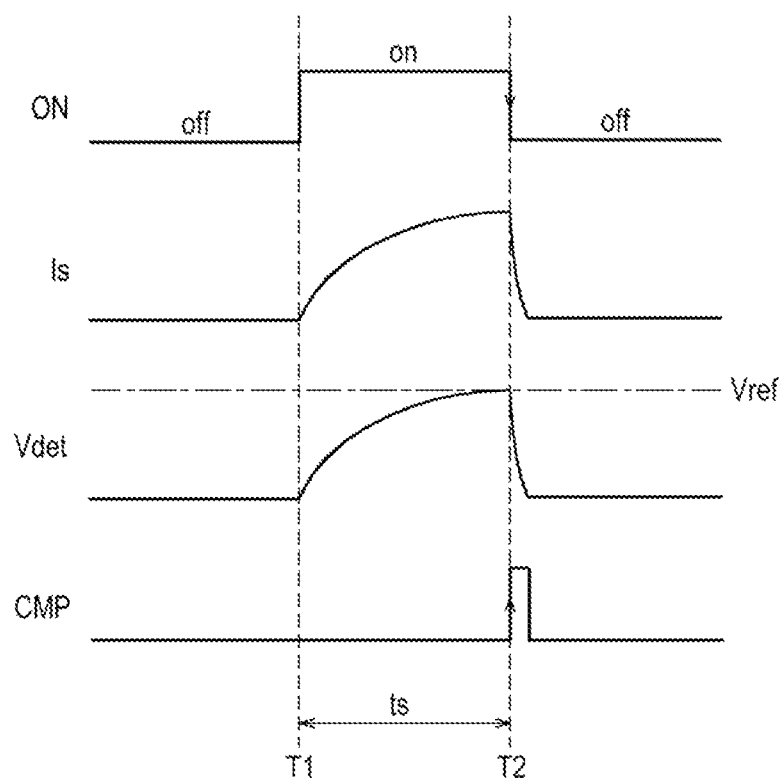
FIG. 13 is a timing chart for illustrating a setting operation of the electrical conduction time.

FIG. 13 is a timing chart for illustrating a setting operation of the electrical conduction time ts, in which an electrical conduction signal ON of the test current Is (i.e., an on/off control signal of one of the transistors Tr1 to Tr6, into which the test current Is is flown), the test current Is, the detection voltage Vdet and the comparison signal CMP are depicted in this order from the top.

In the setting operation of the electrical conduction time ts, the switches SW0, SW3 and SW7 are switched on and the switches SW1, SW2, SW4, SW5 and SW6 are switched off. As a result, the detection voltage Vdet and the reference voltage Vref are compared in the comparator 54.

At time T1, when the controller 20 raises the electrical conduction signal ON to a high level, on/off control is performed of the transistors Tr1 to Tr6 to cause the test current Is to flow through a preset path. For example, when the transistors Tr1 and Tr6 are turned on and the transistors Tr2 to Tr5 are turned off, the test current Is flows from the coil U to the coil V since the coil U and the coil V are connected in series between the application terminal of the source voltage Vcc and the application terminal of the ground voltage GND.

After time T1, the test current Is increases with a lapse of time and the detection voltage Vdet increases accordingly. However, the comparison signal CMP is held at a low level while the detection voltage Vdet is being lower than the reference voltage Vref.

Thereafter, at time T2, when the detection voltage Vdet is higher than the reference voltage Vref, the comparison signal CMP rises to the high level. The controller 20 stops the electrical conduction of the test current Is in response to the rising of the comparison signal CMP to the high level.

Here, the controller 20 measures time taken until the detection voltage Vdet reaches the reference voltage Vref after starting the electrical conduction of the test current Is, and stores a result of the measurement, as electrical conduction time ts (=T2−T1), in a register. This electrical conduction time ts is applied commonly to all test currents Is flowing through a plurality of paths including the coils U, V and W when the rotational position of the motor 90 is detected.

In this manner, when the rotational position of the motor 90 is detected, if the optimal electrical conduction time ts of the test current Is (further, the optical current value of the test current Is) can be automatically determined based on a result of monitoring the detection voltage Vdet generated depending on the test current Is (a result of the comparison with the reference voltage Vref), the test current Is flowing through the plurality of paths including the coils U, V and W can be optimized without depending on the characteristics of the motor 90, thereby improving the detection precision of the rotational position of the motor 90.

Figure 14:
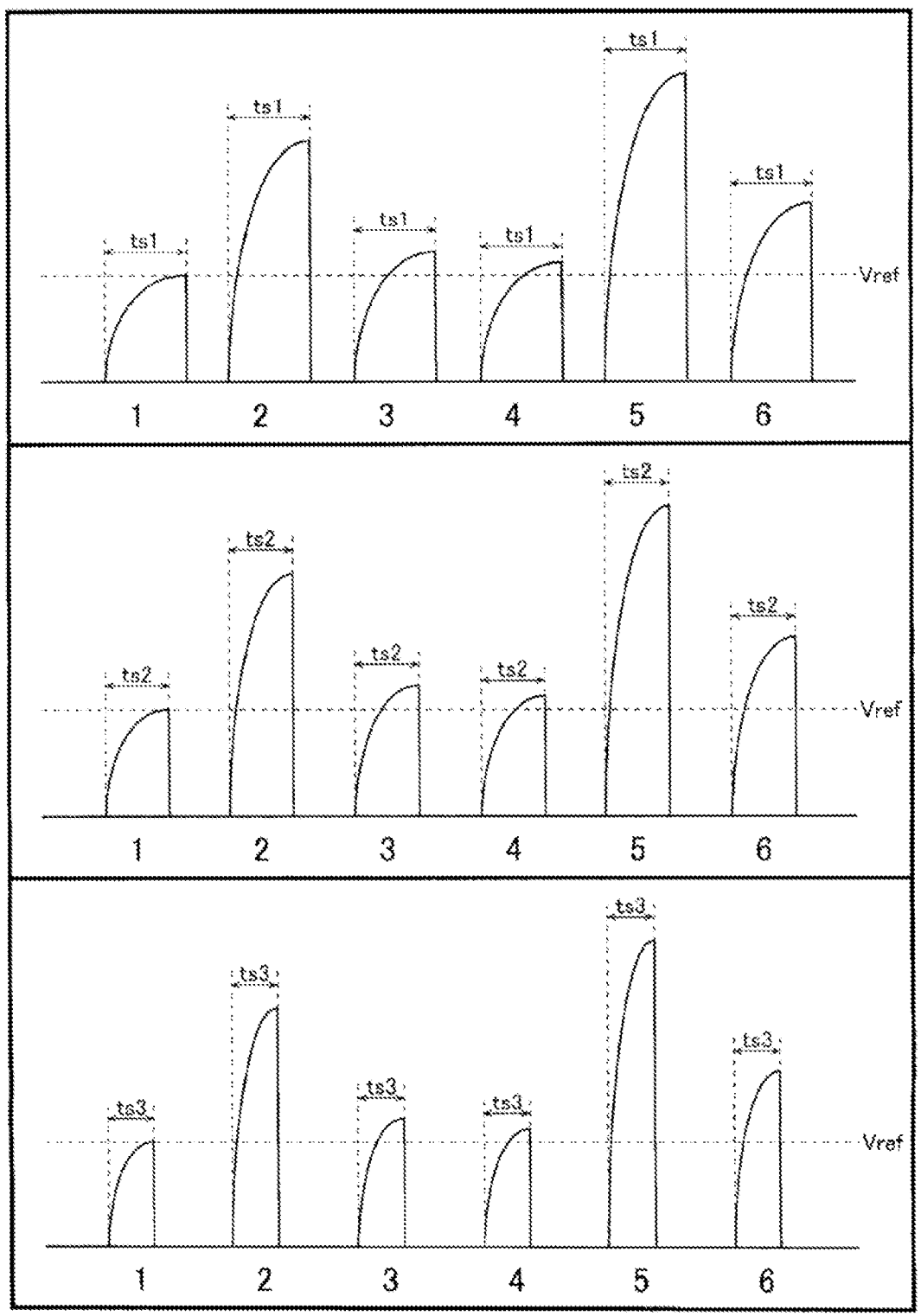
FIG. 14 is a view showing an example of the detection voltage obtained by the stop position detector of the second configuration.

FIG. 14 is a view showing an example of the detection voltage Vdet obtained by the stop position detector 50 of the second configuration. In a test current (Is) electrical conduction sequence illustrated in FIG. 14, upon detecting the rotational position of the motor 90, the setting operation of the electrical conduction time ts, shown in FIG. 13, is performed when the test current Is is flown through Path 1 first selected from Paths 1 to 6 including the coils U, V and W, and, thereafter, for Paths 2 to 6 sequentially selected, the test current Is is flown over the electrical conduction time ts set based on the test current Is flowing through Path 1.

As can be seen from comparison between top, middle and bottom portions in FIG. 14, the electrical conduction time ts of the test current Is has variable values (ts1 to ts3) varied such that the detection voltage Vdet obtained when the test current Is is flown through Path 1 is always equal to the reference voltage Vref. That is, six detection voltages Vdet generated for the respective paths of the test current Is are normalized with the reference voltage Vref.

Accordingly, when the reference voltage Vref is set to the median value or its neighborhood value of the output range of the amplifier 51B, the detection voltage Vdet is always varied near the median value of the output range of the amplifier 51B. As a result, a current value of the test current Is can always fall within a detectable range (a linear region of the detection voltage Vdet) without depending on the characteristics of the motor 90 and the input/output characteristics of the amplifier 51B, which may result in correct detection of rotational positions of a variety of motors.

In addition, according to the above-described configuration that the electrical conduction time ts of the test current Is is variably controlled, the detection voltage Vdet can fall within the output range of the amplifier 51B even when a gain of the amplifier 51B (a gradient of the detection voltage Vdet to the test current Is) is set to be large, which may result in improvement of detection precision of the rotational position. In particular, in a case where a motor having a small rotor magnetic force (for example, a cheap motor using a ferrite magnet as a rotor material) is used, it may be said that it is very beneficial to variably control the electrical conduction time ts of the test current Is since there is a need to set a large gain of the amplifier 51B.

Figure 15:
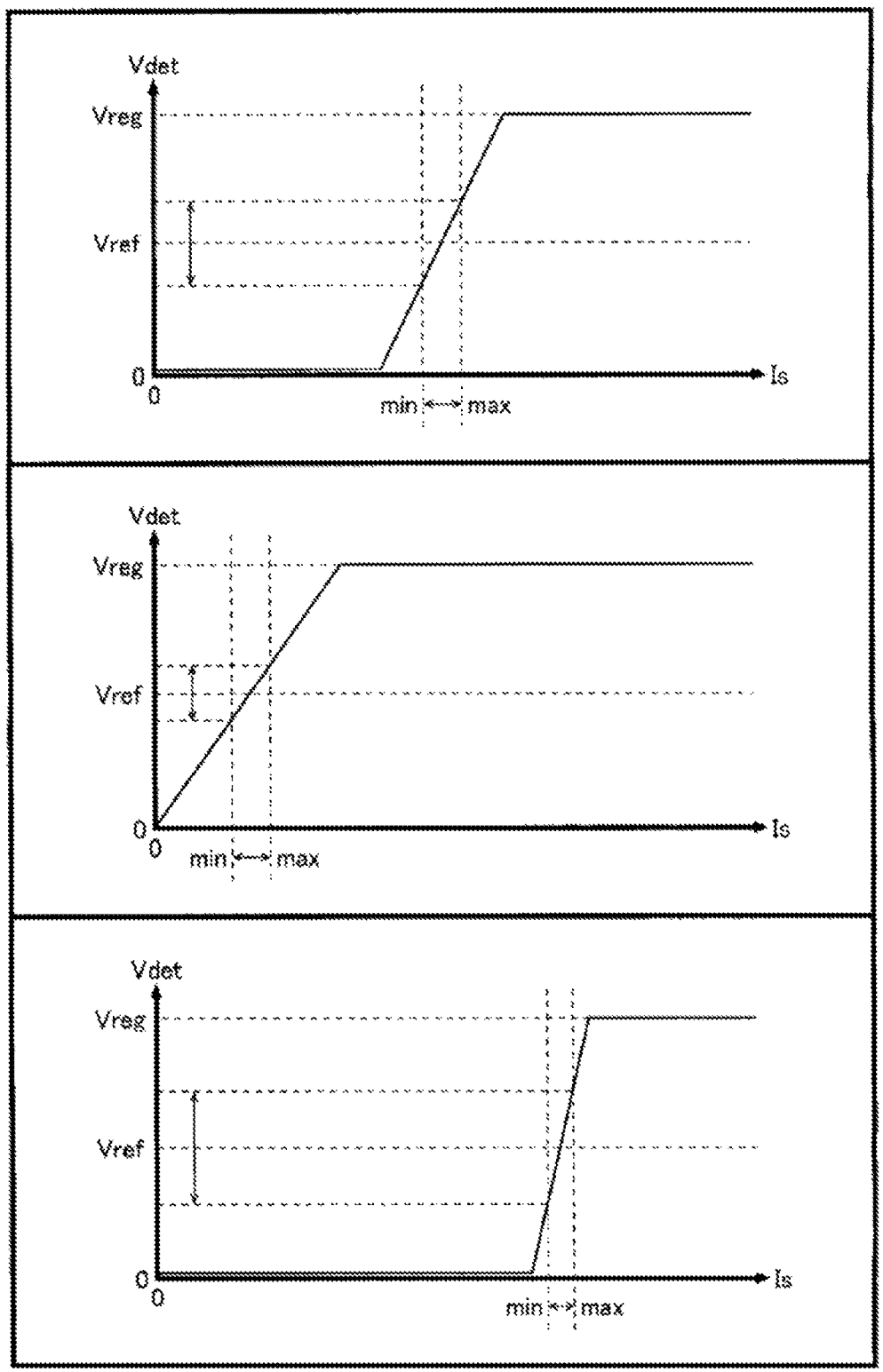
FIG. 15 is a view showing an aspect of change in the test current depending on input/output characteristics of an amplifier.

FIG. 15 is a view showing an aspect of change in the test current Is depending on the input/output characteristics of the amplifier 51B. For example, as illustrated in top, middle and bottom graphs in FIG. 15, if the input/output characteristics of the amplifier 51B can be arbitrarily changed, the input/output characteristics of the amplifier 51B can be optimized depending to the characteristics of the motor 90, which may result in improvement of detection precision of the rotational position. In addition, even when the input/output characteristics of the amplifier 51B are arbitrarily changed, the detection voltage Vdet is varied near the median value of the output range of the amplifier 51B at all times, which may result in unobstructed detection of the rotational position.

In addition, although FIG. 14 has been illustrated with the sequence in which, upon detecting the rotational position of the motor 90, the setting operation of the electrical conduction time ts is performed when the test current Is is flown through Path 1 first selected from Paths 1 to 6 including the coils U, V and W, the timing at which the setting operation of the electrical conduction time ts is not particularly limited. For example, in a case where a sequence in which the sample/hold circuit 53 is pre-charged prior to the electrical conduction to Path 1 is employed, when the test current Is is flown upon the pre-charging, time taken until the detection voltage Vdet reaches the reference voltage Vref may be measured and a result of the measurement may be set as the electrical conduction time ts of the test current Is.

Figure 16:
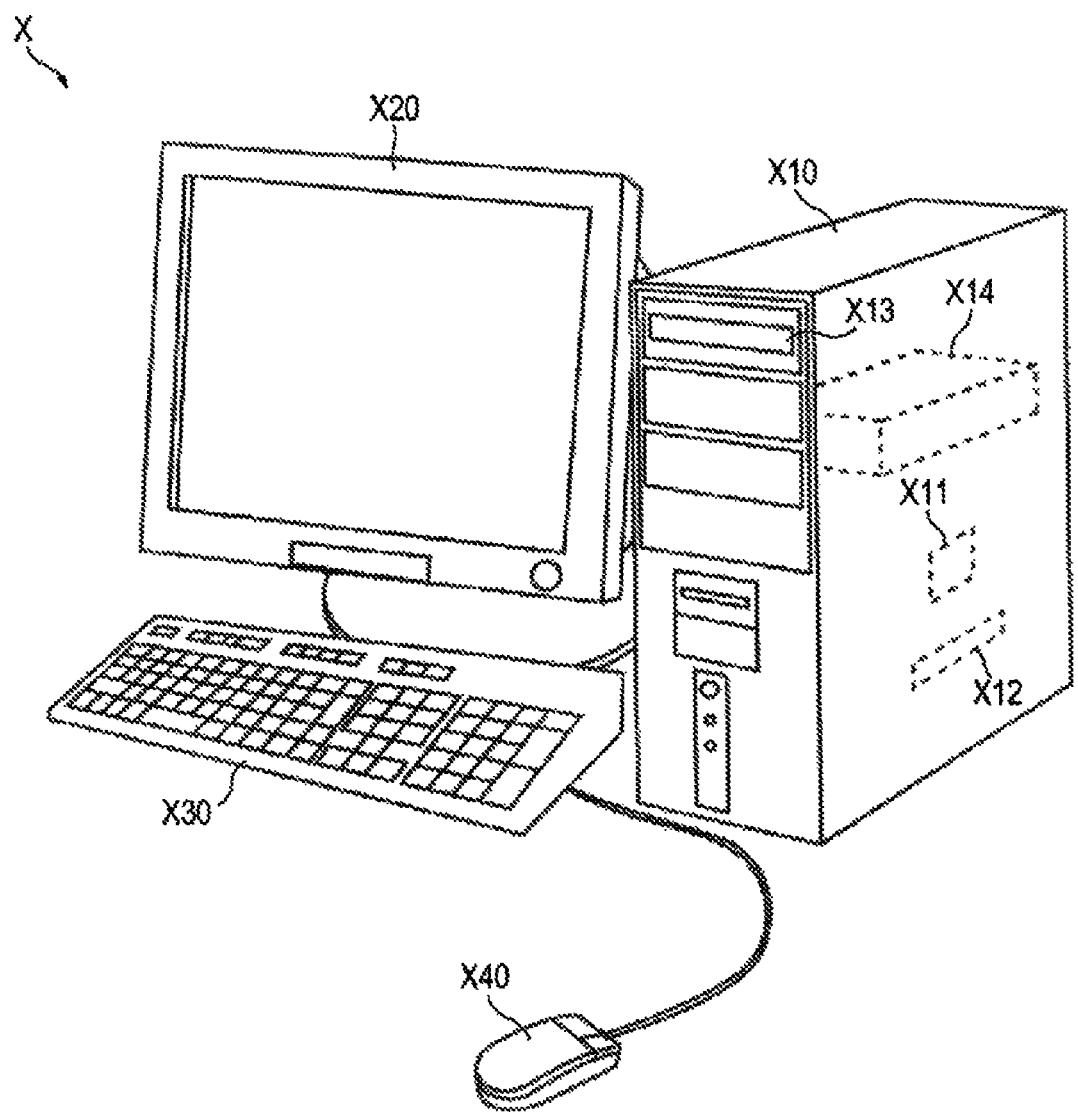
FIG. 16 is an external appearance view showing an example configuration of a desktop personal computer equipped with a rotation control apparatus.

FIG. 16 is an external appearance view showing an example configuration of a desktop personal computer equipped with a rotation control apparatus. A desktop personal computer X of this configuration includes a body case X10, a liquid crystal monitor X20, a keyboard X30 and a mouse X40.

The body case X10 accommodates a central processing unit X11, a memory X12, an optical drive X13, a hard disk drive X14 and so on.

The central processing unit X11 controls the overall operation of the desktop personal computer X by executing an operating system and various application programs stored in the hard disk drive X14.

The memory X12 is used as a working area (for example, an area storing task data upon executing the programs) of the central processing unit X11.

The optical drive X13 performs a read/write operation for an optical disc such as a compact disc (CD), a digital versatile disc (DVD), a Blue-ray disc (BD) or the like.

The hard disk drive X14 is one of mass nonvolatile auxiliary storages storing programs and data using magnetic disks sealed within a housing.

The liquid crystal display monitor X20 outputs an image based on an instruction from the central processing unit X11.

The keyboard X30 and the mouse X40 are human interfaces which receive manipulation by a user.

In the desktop personal computer X as configured above, the above-described rotation control apparatus 10 can be applied to the optical drive X13 to control rotation of an optical disc using a spindle motor and the hard disk drive X14 to control rotation of a magnetic disk.

In addition, although the computer equipped with the optical drive and the hard disk drive has been illustrated as an application of the present disclosure in the above, the application of the present disclosure is not limited thereto. For example, the present disclosure may be applied to a disc playback apparatus (for example, a game machine, a DVD player or the like) equipped with an optical disc playback means. In addition, the rotation control apparatus of the present disclosure can have a wide application to a variety of electronic equipment using a motor, in addition to the disc driving apparatuses.

APPLICABILITY

The present disclosure can be used for rotation control apparatuses to control rotation of motors.

According to the present disclosure in some embodiments, it is possible to provide a technique for correctly detecting a rotational position of a rotor when a motor is started.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A rotation control apparatus comprising:
a controller configured to supply test currents to a plurality of different paths of a motor including a stator having a plurality of coils and a magnetic rotor when the motor is stopped, the plurality of different paths including the plurality of coils; and
a stop position detector including:
an amplifier which has a selector which selectively outputs one of a plurality of output voltages as a select voltage based on the test currents, a current output amplifier which generates detection currents based on the select voltage and the test currents, and a current/voltage converter which converts the detection currents into detection voltages;
a sample/hold circuit receiving the detection voltages, and configured to hold the detection voltages;
a comparator which compares voltage values of the detection voltages held in the sample/hold circuit, and generate comparison signals for the plurality of paths, respectively, based on the comparison of the detection voltages and a reference voltage; and
a switch which is arranged between the comparator and the reference voltage, and makes an electrical connection and an electrical disconnection between an inverted input terminal of the comparator and the application terminal of the reference voltage,
the stop position detector determining an order of the detection voltages for the plurality of different paths and detecting a rotational position of the motor based on a combination of a path having a highest detection voltage and a path having a second-highest detection voltage in the order,
wherein the controller is further configured to supply one of the test currents to flow through one of the plurality of different paths, measure a time taken until the corresponding detection voltage reaches a reference voltage, and set an electrical conduction time of the test currents based on a result of the measurement.

2. The rotation control apparatus of claim 1, wherein the reference voltage is set to a median value or its neighborhood value of an output range of the amplifier.

3. The rotation control apparatus of claim 2, wherein input/output characteristics of the amplifier are changeable.

4. The rotation control apparatus of claim 1, wherein the stop position detector further includes a table storing the order in association with the rotational position of the motor and detects the rotational position of the motor by referring to the table.

5. The rotation control apparatus of claim 1, wherein, when the rotational position of the motor is detected when the motor is stopped, the controller supplies the test current, which is smaller than a current supplied to the path when the motor is being driven, to the path.

6. The rotation control apparatus of claim 1, wherein, when the rotational position of the motor is detected when the motor is stopped, the controller supplies the test current to the path for a period of time which is shorter than a period of time for which a current is supplied to the path when the motor is being driven.

7. The rotation control apparatus of claim 1, wherein the controller pre-charges the sample/hold circuit by supplying the test currents to the paths before measuring the test currents flowing through the plurality of paths.

8. The rotation control apparatus of claim 7, wherein, upon pre-charging the sample/hold circuit, when the test current is flown, the controller measures time taken until the detection voltage reaches the reference voltage and sets the electrical conduction time of the test current based on a result of the measurement.

9. The rotation control apparatus of claim 1, wherein, upon detecting the rotational position of the motor, when the test current is flown through a path first selected, the controller measures time taken until the detection voltage reaches the reference voltage and sets the electrical conduction time of the test current based on a result of the measurement.

10. The rotational control apparatus of claim 1 wherein:
the controller configured to supply test currents to at least three different paths of a motor including a stator having a plurality of coils and a magnetic rotor when the motor is stopped, the at least three different paths including the plurality of coils, and the stop position detector is configured to convert the test currents flowing through the at least three different paths into the detection voltages for measurement, compare the voltage values of the detection voltages, determine an order of the detection voltages for the at least three different paths based on the comparison, and detect a rotational position of the motor based on the combination of the path having the highest detection voltage and the path having the second-highest detection voltage in the order.

11. A rotation control method comprising:

supplying test currents to a plurality of different paths of a motor including a stator having a plurality of coils and a magnetic rotor when the motor is stopped, the plurality of different paths including the plurality of coils;

selectively outputting one of a plurality of output voltages as a select voltage based on the test currents;

generating detection currents based on the select voltage and the test currents;

converting the detection currents into detection voltages;

making an electrical connection and an electrical disconnection between an inverted input terminal of the comparator and an application terminal of a reference voltage by a switch;

comparing voltage values of the detection voltages and determining an order of the detection voltages for the plurality of different paths based on the comparison;

detecting a rotational position of the motor based on a combination of a path having a highest detection voltage and a path having a second-highest detection voltage in the order; and supplying one of the test currents to flow through one of the plurality of different paths, measuring a time taken until the corresponding detection voltage reaches the reference voltage, and setting electrical conduction time of the test currents based on a result of the measurement.

12. The rotation control method of claim 11 including:

supplying test currents to at least three different paths of a motor including a stator having a plurality of coils and a magnetic rotor when the motor is stopped, the at least three different paths including the plurality of coils;

selectively outputting one of a plurality of output voltages as a select voltage based on the test currents;

generating detection currents based on the select voltage and the test currents;

converting the detection currents into detection voltages;

making an electrical connection and an electrical disconnection between an inverted input terminal of the comparator and an application terminal of a reference voltage by a switch;

comparing voltage values of the detection voltages and determining an order of the detection voltages for the at least three different paths based on the comparison; and detecting a rotational position of the motor based on a combination of the path having the highest current value and the path having the second-highest current value in the order.

13. A disk driving apparatus comprising:

a motor configured to rotate a disk, the motor including a stator having a plurality of coils and a magnetic rotor;

a rotation control apparatus configured to control rotation of the motor, the rotation control apparatus including:

a controller configured to test currents to a plurality of different paths of the motor when the motor is stopped, the plurality of different paths including the plurality of coils;

a stop position detector including:

an amplifier which has a selector which selectively outputs one of a plurality of output voltages as a select voltage based on the test currents, a current output amplifier which generates detection currents based on the select voltage and the test currents, and a current/voltage converter which converts the detection currents into detection voltages;

a sample/hold circuit receiving the detection voltages, and configured to hold the detection voltages;

a comparator which compares voltage values of the detection voltages held in the sample/hold circuit, and generate comparison signals for the plurality of paths, respectively, based on the comparison of the detection voltages and a reference voltage; and a switch which is arranged between the comparator and the reference voltage, and makes an electrical connection and an electrical disconnection between an inverted input terminal of the comparator and the application terminal of the reference voltage, the stop position detector determining an order of the detection voltages for the plurality of different paths and detecting a rotational position of the motor based on a combination of a path having a highest detection voltage and a path having a second-highest detection voltage in the order, wherein the controller is further configured to supply one of the test currents to flow through one of the plurality of different paths, measure a time taken until the corresponding detection voltage reaches a reference voltage, and set an electrical conduction time of the test currents based on a result of the measurement; and a read/write controller configured to write/read data into/from the disk.

14. A computer equipped with a disk driving apparatus of claim 13, wherein the disk driving apparatus is at least one of an optical drive and a hard disk drive.

15. A disk playback apparatus equipped with a disk driving apparatus of claim 13 as a disk playback means.

16. The disk driving apparatus of claim 13 wherein:

the controller configured to supply test currents to at least three different paths of a motor including a stator having a plurality of coils and a magnetic rotor when the motor is stopped, the at least three different paths including the plurality of coils, and the stop position detector including:

an amplifier which has a selector which selectively outputs one of a plurality of output voltages as a select voltage based on the test currents, a current output amplifier which generates detection currents based on the select voltage and the test currents, and a current/voltage converter which converts the detection currents into detection voltages;

a sample/hold circuit receiving the detection voltages, and configured to hold the detection voltages;

a comparator which compares voltage values of the detection voltages held in the sample/hold circuit, and generate comparison signals for the plurality of paths, respectively, based on the comparison of the detection voltages and a reference voltage; and a switch which is arranged between the comparator and the reference voltage, and makes an electrical connection and an electrical disconnection between an inverted input terminal of the comparator and the application terminal of the reference voltage, the stop position detector determining an order of the detection voltages for the plurality of different paths and detecting a rotational position of the motor based on a combination of a path having a highest detection voltage and a path having a second-highest detection voltage in the order.

* * * * *